(12) United States Patent
Letertre et al.

(10) Patent No.: US 8,252,664 B2
(45) Date of Patent: Aug. 28, 2012

(54) FABRICATION OF SUBSTRATES WITH A USEFUL LAYER OF MONOCRYSTALLINE SEMICONDUCTOR MATERIAL

(75) Inventors: Fabrice Letertre, Meylan (FR); Bruno Ghyselen, Seyssinet (FR); Olivier Rayssac, Grenoble (FR); Pierre Rayssac, legal representative, Grenoble (FR); Gisèle Rayssac, legal representative, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/246,316

(22) Filed: Sep. 27, 2011

(65) Prior Publication Data

US 2012/0012048 A1    Jan. 19, 2012

Related U.S. Application Data

(60) Continuation of application No. 12/984,895, filed on Jan. 5, 2011, which is a continuation-in-part of application No. 11/831,484, filed on Jul. 31, 2007, now Pat. No. 7,888,235, which is a division of application No. 10/883,437, filed on Jul. 1, 2004, now Pat. No. 7,265,029, which is a continuation of application No. 10/458,471, filed on Jun. 9, 2003, now abandoned, and a continuation-in-part of application No. 10/446,605, filed on May 27, 2003, now Pat. No. 6,794,276, which is a continuation of application No. PCT/FR01/03714, filed on Nov. 26, 2001.

(30) Foreign Application Priority Data

Nov. 27, 2000  (FR) .................................... 00 15279
Jun. 11, 2002  (FR) .................................... 02 07132
Jan. 24, 2003  (FR) .................................... 03 00780

(51) Int. Cl.
    H01L 21/46    (2006.01)
(52) U.S. Cl. .................................................. 438/458
(58) Field of Classification Search ................ None
    See application file for complete search history.

(56) References Cited

U.S. PATENT DOCUMENTS

| | | | |
|---|---|---|---|
| 5,229,305 A | 7/1993 | Baker | 438/459 |
| 5,374,564 A | 12/1994 | Bruel | 438/455 |
| 5,376,580 A | 12/1994 | Kish et al. | 437/127 |
| 5,391,257 A | 2/1995 | Sullivan et al. | 438/458 |
| 5,759,908 A | 6/1998 | Steckl et al. | 438/479 |
| 5,773,844 A | 6/1998 | Kawamura et al. | 257/57 |
| 5,846,844 A | 12/1998 | Akasaki et al. | 438/24 |
| 5,869,387 A | 2/1999 | Sato et al. | 438/459 |
| 5,877,070 A | 3/1999 | Goesele et al. | 438/458 |
| 5,880,491 A | 3/1999 | Soref et al. | 257/190 |
| 5,953,622 A | 9/1999 | Lee et al. | 438/458 |

(Continued)

FOREIGN PATENT DOCUMENTS

FR    2 681 472 A1    3/1993

(Continued)

*Primary Examiner* — David E Graybill
(74) *Attorney, Agent, or Firm* — Winston & Strawn LLP

(57) ABSTRACT

The invention relates to methods for fabricating a semiconductor substrate. In one embodiment, the method includes providing a support that includes a barrier layer thereon for preventing loss by diffusion of elements derived from dissociation of the support at epitaxial growth temperatures; providing a seed layer on the barrier layer, wherein the seed layer facilitates epitaxial growth of a single crystal III-nitride semiconductor layer thereon; epitaxially growing a nitride working layer on the thin seed layer; and removing the support to form the substrate.

15 Claims, 3 Drawing Sheets

U.S. PATENT DOCUMENTS

| | | | |
|---|---|---|---|
| 5,985,687 A | 11/1999 | Bowers et al. | 438/46 |
| 6,020,252 A | 2/2000 | Aspar et al. | 438/458 |
| 6,071,795 A | 6/2000 | Cheung et al. | 438/458 |
| 6,074,892 A | 6/2000 | Bowers et al. | 438/57 |
| 6,103,597 A | 8/2000 | Aspar et al. | 438/458 |
| 6,114,188 A | 9/2000 | Oliver et al. | 438/107 |
| 6,176,925 B1 | 1/2001 | Solomon et al. | 117/89 |
| 6,177,292 B1 | 1/2001 | Hong et al. | 438/46 |
| 6,177,359 B1 | 1/2001 | Chen et al. | 438/751 |
| 6,190,998 B1 | 2/2001 | Bruel et al. | 438/407 |
| 6,191,007 B1 | 2/2001 | Matsui et al. | 438/459 |
| 6,210,479 B1 | 4/2001 | Bojarczuk et al. | 117/84 |
| 6,214,701 B1 | 4/2001 | Matsushita et al. | 438/458 |
| 6,218,280 B1 | 4/2001 | Kryliouk et al. | 438/607 |
| 6,225,190 B1 | 5/2001 | Bruel et al. | 438/458 |
| 6,225,192 B1 | 5/2001 | Aspar et al. | 438/460 |
| 6,251,754 B1 | 6/2001 | Ohshima et al. | 438/506 |
| 6,280,523 B1 | 8/2001 | Coman et al. | 117/101 |
| 6,303,405 B1 * | 10/2001 | Yoshida et al. | 438/46 |
| 6,303,468 B1 | 10/2001 | Aspar et al. | 438/455 |
| 6,326,279 B1 | 12/2001 | Kakizaki et al. | 438/406 |
| 6,328,796 B1 | 12/2001 | Kub et al. | 117/94 |
| 6,335,263 B1 | 1/2002 | Cheung et al. | 438/455 |
| 6,391,799 B1 | 5/2002 | Di Cioccio | 438/781 |
| 6,420,242 B1 | 7/2002 | Cheung et al. | 438/458 |
| 6,426,270 B1 | 7/2002 | Sakaguchi et al. | 438/455 |
| 6,447,938 B1 | 9/2002 | Bianchi | 428/698 |
| 6,534,382 B1 | 3/2003 | Sakaguchi et al. | 438/455 |
| 6,559,075 B1 | 5/2003 | Kelly et al. | 438/795 |
| 6,566,256 B1 | 5/2003 | Solomon et al. | 438/680 |
| 6,569,748 B1 | 5/2003 | Sakaguchi et al. | 438/455 |
| 6,693,021 B1 | 2/2004 | Motoki et al. | 438/481 |
| 6,756,286 B1 | 6/2004 | Moriceau et al. | 438/459 |
| 6,794,276 B2 | 9/2004 | Letertre et al. | 438/506 |
| 6,867,067 B2 | 3/2005 | Ghyselen et al. | 438/107 |
| 6,974,759 B2 | 12/2005 | Moriceau et al. | 438/459 |
| 7,029,993 B1 | 4/2006 | Barge et al. | 438/475 |
| 7,235,462 B2 | 6/2007 | Letertre et al. | 438/455 |
| 2002/0121642 A1 | 9/2002 | Doverspike et al. | 257/97 |
| 2003/0143772 A1 | 7/2003 | Chen | 438/47 |
| 2003/0159644 A1 | 8/2003 | Yonehara et al. | 117/8 |
| 2004/0002190 A1 | 1/2004 | Chang et al. | 438/257 |
| 2004/0029359 A1 | 2/2004 | Letertre et al. | 438/458 |
| 2005/0266626 A1 | 12/2005 | Faure et al. | 438/197 |
| 2006/0121702 A1 | 6/2006 | Coman et al. | 438/483 |
| 2006/0255341 A1 | 11/2006 | Pinnington et al. | 257/79 |
| 2007/0269960 A1 | 11/2007 | Letertre et al. | 438/458 |
| 2009/0278233 A1 | 11/2009 | Pinnington et al. | 257/615 |
| 2011/0117726 A1 | 5/2011 | Pinnington et al. | 438/458 |

FOREIGN PATENT DOCUMENTS

| | | |
|---|---|---|
| FR | 2 774 214 A1 | 7/1999 |
| FR | 2 787 919 A1 | 6/2000 |
| JP | 11-168236 A | 6/1999 |
| WO | WO 00/44966 A1 | 8/2000 |
| WO | WO 02/37556 A1 | 5/2002 |
| WO | WO 02/43112 A2 | 5/2002 |
| WO | WO 02/43124 A2 | 5/2002 |

* cited by examiner

FABRICATION OF SUBSTRATES WITH A USEFUL LAYER OF MONOCRYSTALLINE SEMICONDUCTOR MATERIAL

CROSS-REFERENCE TO RELATED APPLICATIONS

This application is a continuation of application Ser. No. 12/984,895 filed Jan. 5, 2011, which is a continuation-in-part of application Ser. No. 11/831,484 filed Jul. 31, 2007, now U.S. Pat. No. 7,888,235, which is a division of application Ser. No. 10/883,437 filed on Jul. 1, 2004, now U.S. Pat. No. 7,265,029, which is (a) a continuation of application Ser. No. 10/458,471 filed on Jun. 9, 2003, abandoned, and (b) a continuation-in-part of application Ser. No. 10/446,605, filed on May 27, 2003, now U.S. Pat. No. 6,794,276, which is a continuation of International application no. PCT/FR01/03714 filed Nov. 26, 2001. The entire content of each prior application is expressly incorporated herein by reference thereto.

FIELD OF THE INVENTION

The present invention relates to methods of fabricating a semiconductor substrate. In an embodiment, the semiconductor substrate includes at least one layer of monocrystalline semiconductor material, especially a wide band gap material, and in particular a mono or poly-metallic nitride substrate, such as gallium nitride (GaN), indium gallium nitride (InGaN), or aluminum nitride (AlN), or a diamond substrate, on a target substrate.

BACKGROUND OF THE INVENTION

Semiconductor technology based on the use of GaN, AlN, and compounds thereof as semiconductor material, currently suffer from a lack of large-sized bulk substrates of such materials.

The most widely known technique for producing a bulk GaN substrate consists of depositing the GaN on a substrate by a process known as hetero-epitaxy.

In order to produce a substrate having good crystal quality, the substrate material and the epitaxial monocrystal to be deposited thereon, must have little lattice mismatch. Additionally, the thermal expansion coefficient of both the substrate material and the epitaxial monocrystal must be relatively similar, because the high temperatures involved in hetero-epitaxy is known to sometimes cause dissociation and diffusion of elements of the substrate to the epitaxial layer. Thirdly, the substrate material must be mechanically and chemically stable at high temperatures so as to obtain good crystal quality. Naturally, qualities such as surface condition and crystal quality of the starting substrate are also important factors.

Currently, sapphire and silicon carbide (SiC) are commonly used as the substrate material. However, sapphire and silicon carbide are far from being optimal substrate material due to their lattice parameters and their expansion coefficients.

Another common practice is growing layers of GaN on substrates such as zirconium oxide (ZnO), lithium gallium oxide (LiGaO$_2$), lithium aluminum oxide (LiAlO$_2$) (See "Growth of III-Nitrides on ZnO, LiGaO$_2$ and LiAlO$_2$ substrates", Mackenzie et al., J. Electrochem. Soc., vol. 145, No. 7, July 1998, p. 2581) or of neodymium gallium oxide (NdGaO$_3$) (see "GaN bulk substrates for GaN based LEDs and LDs", Oda et al., Phys. Stat. Sol., (a) 180, 51 (2000). Although these substrate materials are often selected for their small lattice mismatch and their similar coefficient of expansion with GaN, they suffer from having poor chemical stability under high temperatures as compared to sapphire or silicon carbide. For example, when the oxide substrates are exposed to high temperatures, dissociation of the metal and/or the oxygen occurs and such dissociated metal and/or oxygen diffuses to the epitaxial layer. As described in Impurity contamination of GaN epitaxial films from the sapphire, SiC, and ZnO substrates, Popovici et al., Appl. Phys. Lett., 71 (23), 8 Dec. 1997, and incorporated herein, contamination of the epitaxial layer by zinc and oxygen from a ZnO substrate compromises the quality and purity of the epitaxial layer.

Furthermore, once the layer or layers intended to form the substrate have been formed, in the majority of cases the support on which growth has been carried out has to be removed, which necessitates either chemical attack of said support and thus its loss even if it is produced from an expensive material, thereby increasing the cost of the process, or by rupture between the layers formed by epitaxial growth and said support, which can be difficult to control and/or can necessitate particular dispositions which complicate the method or make it more expensive.

More generally, it has been proven that, for the purpose of temporary support removal, chip manufacturers mostly prefer an etching technique rather than a rupturing technique. This is mainly because, in the semiconductor industry, etching techniques have been mastered for years and most often do not require any additional investment while rupture techniques are more difficult to control or require significant capital investment, thus adding complexity to the process.

An additional technique for separating the support and the substrates generates stress at the boundary between the support and the substrate by means of laser illumination. Illuminating the support-substrate wafer can generate sufficient stress at the boundary to cause layer separation. Stress can be generated by phase transition, gas evolution, vaporization or sublimation. It is advantageous for one of the support or the substrate to be significantly transparent at the laser wavelength and the other to be significantly absorbent so that absorption of the laser radiation is concentrated at their boundary. See, e.g., U.S. Pat. No. 6,372,608 B1 (especially FIG. 23).

In parallel, an etching approach would be valuable only if the material of the support is relatively inexpensive, but such inexpensive materials, such as gallium Arsenide GaAs, introduce additional drawbacks. In this regard, the article "Preparation of large freestanding GaN substrates by Hydride Vapor Phase Epitaxy using GaAs as a starting substrate", Motoki et al., Jpn. J. Appl. Phys., Vol. 41 (2001), p. 140-143, proposes using a gallium arsenide GaAs substrate on which to grow GaN by hetero-epitaxy. However, when heated to the high temperatures involved in epitaxy, GaAs undergoes surface dissociation, which causes arsenic to evaporate, which can contaminate the GaN monocrystal.

The present invention now seeks to overcome these disadvantages.

SUMMARY OF THE INVENTION

The invention relates to methods for fabricating a semiconductor substrate. In an implementation, the method includes providing an intermediate support, providing a nucleation layer, and optionally but preferably providing at least one bonding layer between the intermediate support and the nucleation layer to improve the bonding energy there between, and to form an intermediate assembly. The technique also includes providing at least one layer of a semiconductor material upon the nucleation layer, bonding a target substrate to the deposited semiconductor material to form a support assembly that includes the target substrate, the deposited semiconductor material, and the intermediate assembly, and then processing the support assembly to remove the intermediate assembly. The result is a semiconductor substrate that includes the at least one layer of semiconductor material on the target substrate.

Preferably, the nucleation layer functions as a barrier layer against diffusion of atoms from the intermediate support at epitaxial growth temperatures, and the semiconductor material layer is epitaxially deposited on the nucleation layer. If desired, a second barrier layer may be provided between the nucleation layer and the intermediate support prior to epitaxially depositing the semiconductor material layer. In an advantageous embodiment, the intermediate support includes a barrier layer that is resistant to diffusing elements derived from dissociation of the intermediate support at epitaxial growth temperatures, and the semiconductor material is epitaxially deposited on the nucleation layer. The barrier layer may be formed by a deposition technique, and in an implementation, the barrier layer is first applied to the intermediate support and then the nucleation layer is applied to the barrier layer. A layer of adhesive may be applied to at least one of a surface of the barrier layer or a surface of the nucleation layer to define a bonding layer.

The intermediate assembly is advantageously provided by implanting atomic species into at least a portion of a source substrate to define the nucleation layer, wherein a main concentration of implanted atomic species defines a detachment zone, applying the at least one bonding layer to at least one of a surface of the nucleation layer or to at least a portion of a surface of the intermediate support, attaching the source substrate implanted with the atomic species, the at least one bonding layer, and at least a portion of the intermediate support together to form a structure, and treating the structure to detach the intermediate assembly from the source substrate at the detachment zone.

According to this aspect of the invention, the intermediate support is preferably selected from the group consisting of silicon, gallium arsenide, zinc oxide, lithium gallium oxide and lithium aluminum oxide. In addition, the nucleation layer may include at least one of silicon carbide, gallium nitride, or sapphire. The semiconductor material also preferably is made of at least one of a mono or poly-metallic nitride, and in particular gallium nitride. The nucleation layer is preferably selected from the group consisting of silicon carbide, gallium nitride and sapphire. If desired, the final support assembly may further include a reflective coating.

Preferably, the at least one bonding layer is made of at least one of silicon oxide or silicon nitride. The target substrate may be made of at least one of monocrystalline or polycrystalline silicon. Advantageously, the final support is chemically treated to remove at least one of the intermediate support or the nucleation layer.

Another embodiment of the invention relates to a method of making a semiconductor substrate which comprises providing an support that includes a barrier layer thereon for preventing loss by diffusion of elements derived from dissociation of the support at epitaxial growth temperatures; providing a seed layer on the barrier layer, wherein the seed layer facilitates epitaxial growth of a single crystal III-nitride semiconductor layer thereon; epitaxially growing a nitride working layer on the thin seed layer; and removing the support to form the substrate.

The support for this embodiment is typically made of a sintered or polycrystalline material, and preferably a polycrystalline silicon carbide, monocrystalline silicon carbide, polycrystalline aluminum nitride, polycrystalline gallium nitride, or monocrystalline gallium nitride having a concentration of dislocation that is greater than $10^7/cm^2$. The barrier layer generally comprises silicon nitride, while the seed layer comprises sapphire, silicon carbide, zinc oxide, silicon, gallium nitride, neodymium gallate, or lithium gallate. The seed layer preferably comprises a material with a crystal lattice parameter selected so that the nitride working layer has a dislocation concentration less than about $10^7/cm^2$ and the nitride working layer comprises one or more layers of GaN, AlN, AlGaN, GaAlN, InGaN, or GaInN.

In one arrangement, the working layer is a stack of deposits of GaN with different types of doping, and the stack of GaN may be self supporting. The working layer may be InGaN; the seed layer GaN and the support substrate sapphire. It is useful for the support and working layer to each have substantially the same thermal expansion coefficient.

The seed and nitride working layers may be detached from the support by the application of stress at the intermediate layer. Also, the seed layer is typically provided on the support by implanting ions into a source substrate to form a zone of weakness at a depth that corresponds to the desired thickness of the seed layer, bonding the source substrate to the support, and detaching the seed layer at the zone of weakness by the application of a force to transfer the seed layer to the support substrate.

Advantageously, the method further comprises recycling the removed support for subsequent reuse. Also, the method can further include preparing the seed layer to receive the nitride working layer, wherein the preparation includes at least one of polishing, annealing, smoothing, oxidation, and etching.

Another aspect of a method for fabricating a semiconductor substrate according to the invention includes transferring a seed layer on to a support substrate, depositing a working layer on the seed layer to form a composite substrate, and detaching the seed layer and the working layer from the composite substrate to form the semiconductor substrate. In this implementation, the material of the seed layer is suitable for accommodating the thermal expansion of the support substrate and the thermal expansion of the working layer.

Preferably, the support substrate comprises a material having thermal expansion coefficients that minimize stresses that arise during variations in temperature. Advantageously, the seed layer is transferred onto the support layer by molecular adhesion. In an implementation, the seed layer and the working layer are detached from the composite substrate by the application of stress at the adhesion interface, wherein the stress is selected from the group consisting of mechanical stress, thermal stress, electrostatic stress and laser irradiation stress, or a combination thereof. This can be achieved through the use of a bonding layer of a material that absorbs the irradiation of the laser on the support substrate prior to transferring to the seed layer thereto to facilitate subsequent detaching of the seed layer and the working layer from the composite substrate.

In an implementation, the working layer is made of gallium nitride. In addition, the seed layer may be made of a material from the group consisting of sapphire, silicon carbide, zinc oxide, silicon, gallium nitride, neodymium gallate, and lithium gallate. The support layer may be made of a material selected from the group consisting of silicon carbide, aluminum nitride, silicon, and sapphire. Advantageously, the seed layer and the support layer have substantially the same chemical composition.

The support substrate material preferably comprises amorphous materials, polycrystalline materials, and sintered materials. More preferably the support comprises materials such as polycrystalline silicon carbide, monocrystalline silicon carbide, polycrystalline aluminum nitride, polycrystalline gallium nitride, and monocrystalline gallium nitride having a high concentration of dislocations (greater than $10^7/cm_2$). The materials for both the seed layer and the support may have the same chemical composition.

In a beneficial embodiment, the method further includes applying an intermediate layer between the seed layer and the support. The intermediate layer may be at least one of a bonding layer or an insulating layer.

Preferably, the seed layer includes crystal lattice parameter(s) selected so that the epitaxially grown seed layer such that the working layer has a dislocation concentration less than about $10^7/cm^2$. Such materials are known in the art and include nitrides such as GaN. An advantageous implementation includes providing a source substrate including the seed layer and a weakened zone, and detaching the seed layer from the source substrate at the weakened zone. In this embodiment, the weakened zone includes implanted atomic species at a depth that corresponds to the thickness of the source substrate, and the seed layer may be detached from the source substrate by application of at least one of heat treatment, mechanical stress, thermal stress, chemical etching, or a combination thereof.

The seed layer may also be selected to obtain a precise crystal structure and orientation, for example to obtain hexagonal or cubic gallium nitride, or if an Si face or a C face is selected to deposit the working layer on a seed layer of silicon carbide; the seed layer is made of gallium nitride of very high quality, i.e., having fewer than $10^6$ dislocations per square centimeter, e.g., gallium nitride obtained by an epitaxial lateral overgrowth (ELOG) technique.

The method according to this aspect of the invention preferably further includes preparing the seed layer to receive the working layer, wherein the preparation includes at least one of polishing, annealing, smoothing, oxidation, and etching. The method may also advantageously include removing the support substrate such that it remains in a condition sufficient for recycling and reuse.

In this method, the working layer advantageously comprises a metal nitride, the seed layer advantageously comprises a material from the group consisting of sapphire, silicon carbide, zinc oxide, silicon, gallium nitride, neodymium gallate, and lithium gallate, and the support substrate advantageously comprises a material from the group consisting of silicon carbide, aluminum nitride, silicon, and sapphire. Preferably, the metal nitride is GaN, AlN, AlGaN, GaAlN, InGaN, or GaInN and the working layer is a stack of deposits of GaN with different types of doping. In some embodiments, the stack of GaN may be self supporting. Also, the working layer may also be InGaN with the seed layer GaN and the support substrate sapphire.

The method may further comprise applying an intermediate layer comprising at least one of a bonding layer or an insulating layer between the seed layer and the support substrate. Typical bonding layers comprise at least one of silicon oxide or silicon nitride. Also, the seed layer may comprise a material with a crystal lattice parameter selected so that the working layer has a dislocation concentration less than about $10^7/cm^2$.

The method may further comprise providing a source substrate including the seed layer wherein the seed layer is made of a material that absorbs laser radiation, and detaching the support substrate from the source substrate at the seed layer by the application of laser irradiation stress.

In another embodiment, the invention relates to a method for fabricating a semiconductor substrate, which comprises providing a source substrate with a weakened zone defining a seed or nucleation layer and a support substrate bonded thereto; depositing at least one working layer of a semiconductor material upon the seed or nucleation layer; providing a target substrate upon the working layer of the deposited semiconductor material to form a support assembly comprising the target substrate, the deposited semiconductor material, the seed or nucleation layer, and support substrate; and removing the support assembly by applying laser irradiation stress to the seed or nucleation layer to provide a semiconductor substrate comprising the at least one layer of semiconductor material on the target substrate.

In this method, the target substrate may be a thick layer deposited on the working layer before irradiation detachment of the support assembly. Alternatively, the target substrate may be provided upon the working layer by metal bonding of the target substrate to the working layer. Preferably, the semiconductor material layer comprises gallium nitride, and wherein the nucleation layer is selected from the group consisting of silicon carbide, gallium nitride and sapphire, the intermediate support is selected from the group consisting of silicon, gallium arsenide, zinc oxide, lithium gallium oxide and lithium aluminum oxide, and the at least one bonding layer comprises at least one of silicon oxide or silicon nitride.

The weakened zone typically comprises implanted atomic species at a depth that corresponds to the thickness of the source substrate. Thus, the support substrate may be removed for subsequent recycling and reuse. Also, components may be formed on or in the working layer either before or after removing the support substrate.

In aspects of this embodiment, the material and the thickness of the nucleation layer are selected so that thermal expansion of the support substrate and of the working layer occurs without significant damage; the semiconductor material layer is epitaxially deposited on the nucleation layer and the nucleation layer comprises a barrier layer against diffusion of atoms from the intermediate support at epitaxial growth temperatures; the intermediate assembly is removed by etching; and the providing step further comprises affixing the nucleation layer to the at least one bonding layer and to the support substrate by molecular bonding.

In further aspects of this embodiment, the semiconductor material layer comprises gallium nitride; the nucleation layer is selected from the group consisting of silicon carbide, gallium nitride and sapphire; the intermediate support is selected from the group consisting of silicon, gallium arsenide, zinc oxide, lithium gallium oxide and lithium aluminum oxide; the at least one bonding layer comprises at least one of silicon oxide or silicon nitride; the weakened zone comprises implanted atomic species at a depth that corresponds to the thickness of the source substrate; and the support substrate is removes for subsequent recycling and reuse.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

Other aspects, aims and advantages of the present invention become clear from the following description of a preferred implementation, given by way of non-limiting example and made with reference to the accompanying drawings in which.

DETAILED DESCRIPTION OF THE PREFERRED EMBODIMENTS

Preferred embodiments of the invention are now described. It should be understood that the preferred embodiment using Bernoulli wands are not limiting and other embodiments of this invention do not use Bernoulli wands. Headings are used herein for clarity only and without any intended limitation.

The present invention preferably provides a method for fabricating a substrate by hetero-epitaxial growth wherein the epitaxial layer(s) is protected against contamination from the substrate material despite exposure to the high temperatures necessary for growth. The invention also provides a method for easy removal of the support on which the epitaxial layer is grown.

Generally, when the intermediate support is a material that can be chemically attacked by a given attack medium, e.g., GAs, it is preferable for the material of the nucleation layer to be one that forms a barrier against diffusion of elements deriving from any thermal dissociation of the intermediate support material. According to the present invention, it is also possible to select a substrate that is not easily chemically removed, and to detach it using laser irradiation. This enables the substrate to possibly be recycled. For example, sapphire is a substrate that is transparent to laser irradiation and SiN can be used as an absorbing bonding layer.

In one specific arrangement, the method involves epitaxial growing of the monocrystalline semiconductor material on the nucleation layer. Preferably, monocrystalline semiconductor material is deposited on the nucleation layer by epitaxy. However, other methods are suitable, as is known in the art.

As noted above, the material of the intermediate support is one that can be chemically attacked or etched by a given etching medium, it is subject to thermal dissociation when exposed to a the temperature of epitaxial growing of the semiconductor layer, and is made of a material that is less expensive than materials that are more resistant to thermal dissociation at epitaxial growth temperatures.

Referring to FIGS. 1A to 1G, FIG. 1A shows a source substrate 10, such as monocrystalline silicon carbide SiC, in which ions, e.g., hydrogen ions, have been implanted at a certain depth using an ionic bombardment machine, a plasma implantation machine, or any other known method in the art. The implantation of ions defines a nucleation layer or seed layer 12 of implanted ions on a portion of the source substrate 10, wherein the main concentration of ions on the source substrate define a detachment zone or weakened zone 14. Typically, ions are implanted to a depth in the range of about 200 nanometers (nm) to 1000 nm, using ions with energy in the range of about 50 kilo electron volts (keV) to 200 keV, and an implantation dose in the range of about $5 \times 10^{16}$ ions per square centimeter (ions/cm$^2$) to $1 \times 10^{16}$ ions/cm$^2$.

Figure 1A:
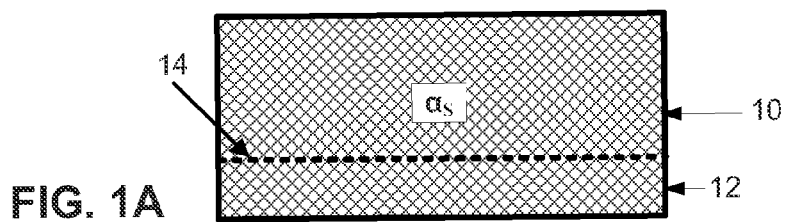
FIG. 1A illustrates an initial step of a method in accordance with an aspect the invention further illustrating source substrate 10 and seed layer 12 each thermal expansion coefficient $\alpha_S$.
Figure 1B:
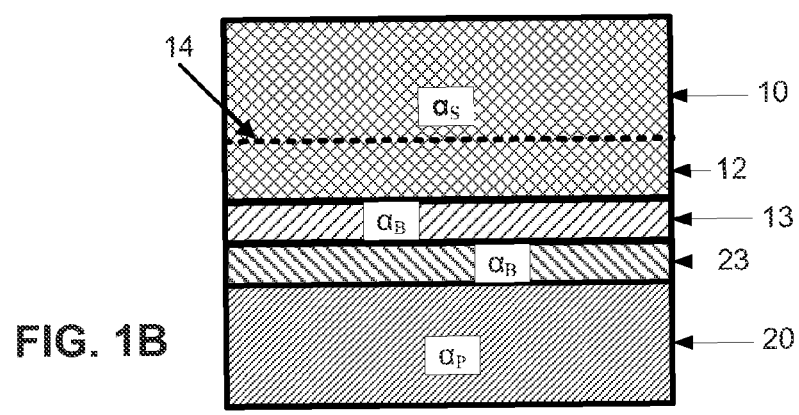
FIG. 1B illustrates a further step of a method in accordance with an aspect of the invention further illustrating support substrate 20 and bonding layers 13 and 23 with thermal expansion coefficients $\alpha_P$ and $\alpha_B$, respectively.

Referring to FIG. 1B, substrate 10 having layer 12 is attached to an intermediate growth support substrate 20 by molecular bonding to form a source substrate-intermediate growth support substrate assembly. For example, the growth support substrate 20 may comprise monocrystalline gallium arsenide GaAs. Typically, the intermediate growth support substrate 20 has a thickness in the range of about 400 micrometers (μm) to 800 μm.

Optionally, at least one surface of source substrate 10 and/or support substrate 20 is provided with bonding layers 13, 23 in a manner known in the art. The expansion of bonding layer is negligible due to its small thickness compared with the thickness of the other layers (e.g., seed, working layers and substrates). Such bonding layers may be silicon oxide SiO$_2$ or silicon nitride Si$_3$N$_4$. However, other materials may be used as known in the art. When formed from SiO$_2$ on Si, the bonding layer(s) are provided on the surface of the source substrate or the intermediate support substrate by thermal oxidation, or alternatively, by deposition. The bonding energy of the bonding interface is brought to the required level by heat treatment, typically at a temperature of more than about 300° C. for a period that is typically 2 hours. However, other known methods may be used.

Stresses, such as thermal, laser irradiation, and/or mechanical, but which could be of some other nature, are applied to the source substrate-intermediate growth support substrate assembly so as to detach the intermediate growth support substrate 20 and the nucleation layer or seed layer 12 from the remaining source substrate 10, at the detachment zone 14. Such detachment can be accomplished using the known Smart-Cut® technique developed by Applicant. To this end, a heat treatment is typically carried out at a temperature in the range 800° C. to 900° C. for a period in the range 30 minutes to 3 hours. Such heat treatment can be combined with that used to strengthen the bonding interface.

Figure 1C:
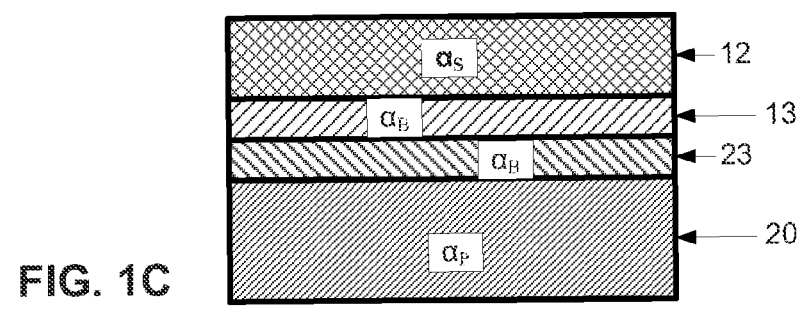
FIG. 1C illustrates a further step of a method in accordance with an aspect of the invention.

As illustrated in FIG. 1C, a structure comprising a GaAs growth support 20 having a thin nucleation layer 12 of monocrystalline SiC is obtained. The free surface of said layer can undergo polishing/cleaning and in particular chemical-mechanical polishing or ion beam smoothing intended to allow good-quality epitaxial growth to be performed thereon.

A metal organic chemical vapor deposition (MOCVD) hetero-epitaxy technique is carried out on this surface to produce a stack of deposits of gallium nitride GaN with different types of doping, said technique being known to produce a GaN stack or working layer 30 having good crystal quality.

Such technique is carried out at a temperature of about 1050° C. to 1100° C., at which temperature partial dissociation of the GaAs of the support substrate 20 is observed. The presence of the SiC nucleation layer 12, however, forms a barrier layer against the diffusion of arsenic or gallium atoms towards the deposited layer 30, and thereby maintains the quality of the and the purity of layer 30.

The stack of GaN is typically a few microns thick, i.e., it is a thin layer, as opposed to the thick layers with a minimum thickness of about 200 μm to 300 μm, which renders the stack self-supporting.

Figure 1D:
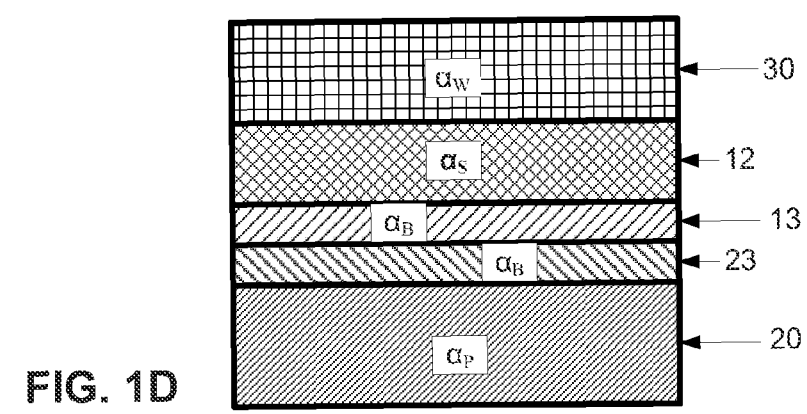
FIG. 1D illustrates a further step of a method in accordance with an aspect of the invention further illustrating working layer 30 with thermal expansion coefficient $\alpha_W$.
Figure 1E:
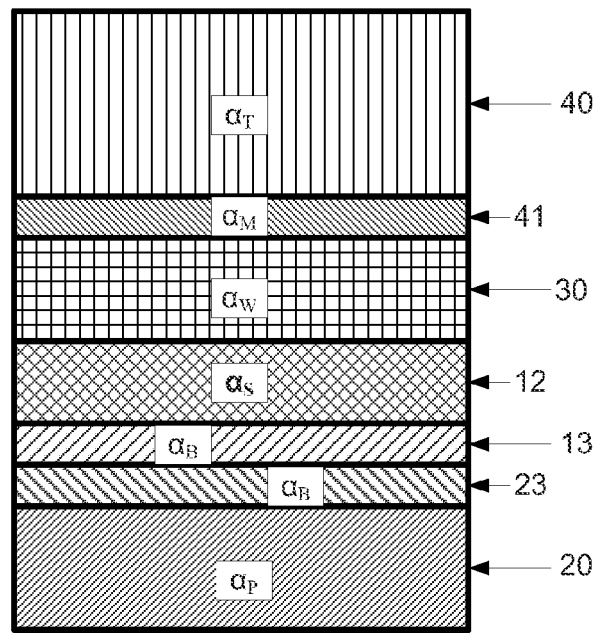
FIG. 1E illustrates a further step of a method in accordance with an aspect of the invention further illustrating target substrate 40 and metallization layer 41 with thermal expansion coefficients $\alpha_T$ and $\alpha_M$, respectively.
Figure 1F:
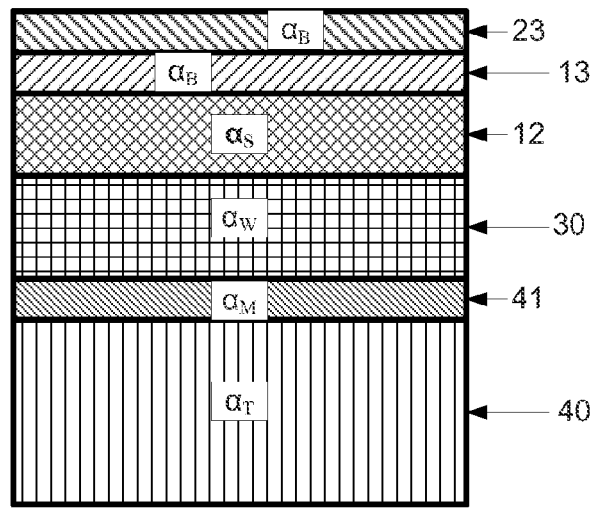
FIG. 1F illustrates a further step of a method in accordance with an aspect of the invention.
Figure 1G:
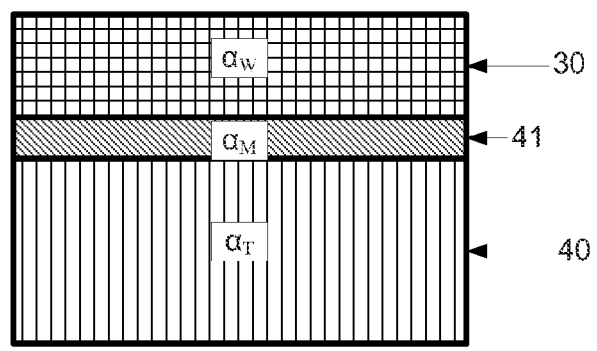
FIG. 1G illustrates a further step of a method in accordance with an aspect of the invention.

FIG. 1D shows the resulting structure.

After growth of the GaN stack 30, the assembly comprising the support substrate layers 20, bonding layer 23, bonding layer 13, implanting layer 12 and layer 30 is applied to a target substrate 40 of monocrystalline or polycrystalline silicon so as to form the final support of the GaN layer.

At its surface receiving the GaN layer, said final support 40 advantageously has metallization 41 allowing the final support to comprise a reflector for visible or UV radiation emitted by the electroluminescent components which have been formed in the layer 30. The metallization 41 of the surface of the final support 40 is preferably achieved by cathode sputtering or vacuum evaporation of gold, tin, or palladium (or of any suitable alloy) with a thickness of 500 nm, for example. The thermal expansion of the metallization layer is negligible due to its small thickness compared with the thickness of other layers (e.g., seed, working layers and substrates).

The free surface of the GaN stack 30 undergoes polishing treatment, typically a chemical-mechanical polishing or ion beam smoothing intended to provide a flatness that is suitable for molecular bonding with the target substrate 40, which itself must have satisfactory flatness prior to metallization.

The thickness of substrate 40 is typically in the range of about 300 μm to 500 μm.

Fixing is achieved by molecular bonding or by eutectic bonding (which means that polishing can be dispensed with), if necessary supplying heat energy at a temperature in the range 200° C. to 350° C. for several hours to produce the desired bonding forces.

Optionally, prior to fixing, the GaN stack 30 can undergo all or some treatments for producing components such as blue or green LEDs, laser diodes, etc.

When Gas is used as the intermediate substrate, the assembly is exposed to chemical attack with a solution comprising a mixture including HF, $HNO_3$, $CH_3COOH$, and $H_2O$ in proportions of 1:3:3:5 to completely remove the intermediate GaAs support 20. Alternatively, it is possible to use a substrate that is not easily chemically removed and in that event it can be detached using laser irradiation. For example, sapphire is a substrate that is transparent to laser irradiation and in that case SiN can be used as an absorbing bonding layer that is fractured by the laser irradiation so that the sapphire substrate can be detached.

The nucleation layer, and if appropriate, the bonding layers 13, 23 (if they have not been removed chemically) are removed preferably by ionic etching. Additionally, it is also possible to remove a portion of the epitaxial layers that have been formed, in particular to remove initial epitaxial layers containing defects.

The method described herein with mention of certain examples is not meant to be limiting, and as is known in the art variants are also encompassed within the invention. For instance, the choice of nucleation layer 12 is principally conditioned by the search for a compromise between the lattice parameter, thermal expansion coefficient, stability at high temperatures, ability to form a barrier layer against the diffusion of elements from possible partial decomposition of the layer forming the intermediate support. Preferably, either SiC as indicated above is selected, or GaN, or even sapphire is selected. However, other materials may be used as known in the art.

The material of the intermediate support 20 is not critical as regards to lattice parameter, but it should be selected principally as a result of finding a compromise between its thermal expansion coefficient compared with that of the material of the epitaxial layer, the stability of the epitaxial layer under high temperatures, and in particular the facility with which it is removed chemically.

In addition to GaAs, other materials may be used such as silicon, certain oxides such as ZnO, $LiGa_2$ or $NdGaO_3$. Further, the material deposited by epitaxial growth to form the useful layer or layers of the substrate is typically a stack of differently doped layers of GaN, in a manner that is known in the art. However, it can also be a stack of a variety of other metal nitrides such as AlN or GaAlN, etc.

Finally, the final support 40 can be any support selected as a function of a compromise between its ability to receive the metallization 41 if appropriate, its ability to receive the deposited layer 30 by bonding or any other technique, its properties in terms of mechanical and chemical stability during treatments for producing components in the stack of layers 30, its thermal properties, its fabrication cost, etc.

Preferred embodiments of the invention relate to a substrate for optics, electronics, or opto-electronics, which comprises a seed layer of Si, monocrystalline SiC, sapphire, monocrystalline GaN, $NdGaO_2$, or $LaGaO_2$, a bonding layer of $SiO_2$ or $Si_3N_4$ on the seed layer, and a working layer of GaN, AlN, AlGaN, GaInN, or SiC on the bonding layer.

Table 1 below summarizes examples of materials that are suitable for use in implementing the methods of the invention described above. These are illustrative and should not be construed as limiting the features of the invention.

TABLE 1

| Working layer 16 | Seed layer 2 (typically 1000 Å thick) | Bonding layers 10, 11 (typically 1 μm thick) | Support 12 (typically 300 μm thick) |
|---|---|---|---|
| GaN or AlN or AlGaN or GaInN or SiC or other | Mono SiC | $SiO_2$ or $Si_3N_4$ | Poly SiC or mono SiC or sapphire or poly AlN or poly GaN |
| GaN or AlN or AlGaN or GaInN or SiC or other | {111} Si | $SiO_2$ or $Si_3N_4$ | Poly SiC or mono SiC or sapphire or poly AlN or poly GaN |
| GaN or AlN or AlGaN or GaInN or SiC or other | Sapphire | $SiO_2$ or $Si_3N_4$ | Poly SiC or mono SiC or sapphire or poly AlN or poly GaN |

TABLE 1-continued

| Working layer 16 | Seed layer 2 (typically 1000 Å thick) | Bonding layers 10, 11 (typically 1 μm thick) | Support 12 (typically 300 μm thick) |
|---|---|---|---|
| GaN or AlN or AlGaN or GaInN or SiC or other | Mono GaN | $SiO_2$ or $Si_3N_4$ | Poly SiC or mono SiC or sapphire or poly AlN or poly GaN |
| GaN or AlN or AlGaN or GaInN or SiC or other | $NdGaO_2$ or $LiGaO_3$ | $SiO_2$ or $Si_3N_4$ | Poly SiC or mono SiC or sapphire or poly AlN or poly GaN |

In the above table, as in the tables below, the term "mono" is used to mean "monocrystalline" and the term "poly" is used to mean "polycrystalline".

Another embodiment, not shown in the Figures, comprises two distinct layers deposited on or applied to the intermediate support, one forming a barrier to the diffusion of elements deriving from dissociation of the material of the intermediate support, and the other, outer layer, forming a nucleation layer. It should be noted in this respect that the barrier layer can be formed, deposited or applied either onto the source substrate 10, or onto the intermediate support 20, prior to bonding.

EXAMPLES

The following examples illustrate preferred embodiments of the invention.

Example 1

A 500 nm thick layer of $SiO_2$ is produced on one face of a monocrystalline SiC source substrate by thermal oxidation. Hydrogen ions are then implanted with an energy of 100 keV and using a dose of $8 \times 10^{16}$ ions/cm² into the source substrate using ion bombardment equipment. A 500 μm thick monocrystalline GaAs substrate intended to form the intermediate support is also prepared, and one face of the substrate is coated with a 500 nm thick $SiO_2$ layer by chemical vapor deposition.

Surface activation is then carried out, for example by chemical-mechanical polishing, to smooth the surfaces and provide them with a certain hydrophilic nature. The faces of the source substrate and the intermediate support substrate are then brought together and bonded, and a suitable bonding energy is obtained by heat treatment at 350° C. for a period of 2 hours.

This assembly then undergoes heat treatment at 900° C. for a period of one hour to obtain detachment at the implanted zone. The face of the layer 12 is then polished at the detachment location using ionic smoothing by ion cluster smoothing.

Different GaN layers are then deposited by epitaxial growth. Typically, the GaN stack 30 has the following succession of layers: an 8 nm AlN buffer layer, and a 1 μm GaN layer.

After the operation, the free face of the stack 30 is polished by using an ion cluster technique.

Meanwhile, a monocrystalline silicon substrate with a normal commercial grade of surface polishing and a thickness of 500 μm is coated with a metallization layer based on indium/palladium over a thickness of 400 nm. The intermediate support 20 carrying the stack 30 and the substrate 40 carrying the metallization 41 are then bonded together by molecular bonding, the bonding interface being reinforced by heat treatment at 350° C. for a period of 2 hours. The GaAs intermediate support is then attacked by immersion in an attack solution composed of a mixture of $HF$, $HNO_3$, $CH_2COOH$, and $H_2O$ in proportions of 1:3:3:5, peripheral attack of the metallic layer 41 being minor and without consequence. The attack finishes at the SiC layer 12. This latter layer is then removed, for example by $SF_6/O_2$ reactive ionic etching.

Example 2

Figure 2A:
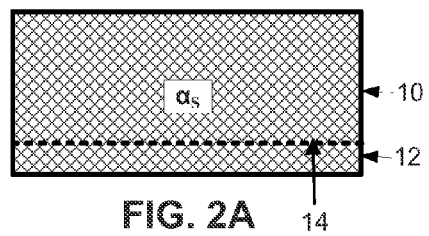
FIG. 2A illustrates an initial step of a method in accordance with another aspect of the invention further illustrating a source substrate with a thermal expansion coefficient $\alpha_S$.
Figure 2B:
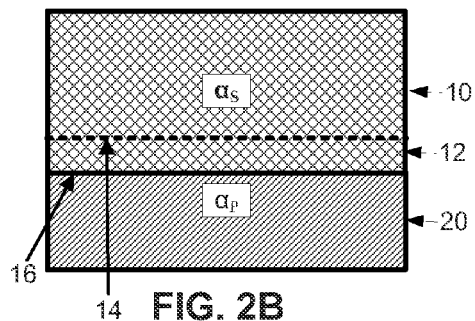
FIG. 2B illustrates a further step of the method in accordance with another aspect of the invention further illustrating support substrate 20 with thermal expansion coefficient $\alpha_P$ where $\alpha_P \neq \alpha_S$.
Figure 2C:
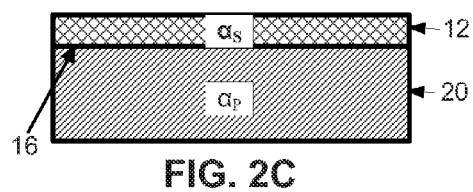
FIG. 2C illustrates a further step of the method in accordance with another aspect of the invention.
Figure 2D:
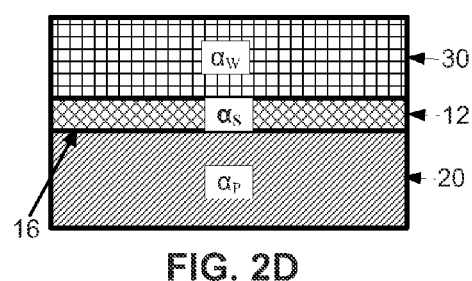
FIG. 2D illustrates a further step of the method in accordance with another aspect of the invention further illustrating working substrate 30 with thermal expansion coefficient $\alpha_W$ where $\alpha_W \neq \alpha_S$ and $\alpha_W \neq \alpha_P$.
Figure 2E:
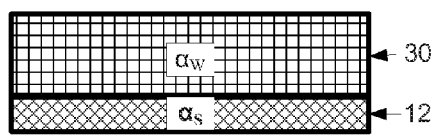
FIG. 2E illustrates a final step of the method in accordance with another aspect of the invention.
Figure 3:
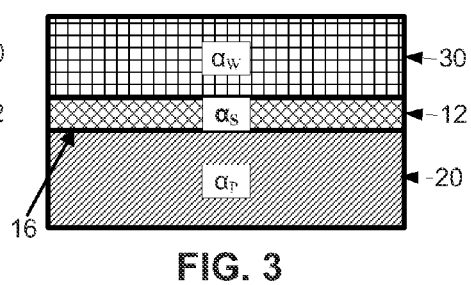
FIG. 3 illustrates a version of the other aspect of the invention of FIG. 2D in which the thermal expansion coefficients are in the relation $0.7\, \alpha_w \leq \alpha \alpha_p \leq 3\, \alpha_w$.

In accordance with another aspect of the invention, referring to FIGS. 2A to 2E, the technique includes transferring a nucleation layer or seed layer 12 onto a support substrate 20 (illustrated in FIG. 2C), depositing a semiconductor layer or working layer 30 on the seed layer 12 to form a composite substrate (illustrated in FIG. 2D), and then detaching the seed layer 12 and the working layer 30 from the composite substrate (illustrated in FIG. 2E). The seed layer in accordance with this aspect of the invention may comprise material such as sapphire, silicon carbide, zinc oxide, silicon, gallium nitride, neodymium gallate, lithium gallate, or any combination thereof. Also included are other materials commonly known in the art. In an implementation, the seed layer 12 is prepared before receiving the working layer, wherein the preparation may include polishing, annealing, smoothing, oxidation, etching or any combination thereof.

Preferably the material comprising the seed layer has a crystal lattice parameter selected to that a working layer that is grown on the seed layer has a dislocation concentration less than about $10^7$/cm².

Also in accordance with this aspect of the invention, the source substrate includes a seed layer 12 and a weakened zone 14 (illustrated in FIG. 2A). In this embodiment, the seed layer 12 is detached from the source substrate 10 at the weakened zone 14, and transferred onto a support substrate 20 (illustrated in FIGS. 2B-C). The detached seed layer 12 is transferred onto the support substrate 20, for example, by molecular adhesion at an adhesion interface 16. A working layer 30 is deposited onto the transferred seed layer 12 to form a composite substrate (illustrated in FIG. 2D). The seed layer 12 and the working layer 30 are detached from the composite substrate at the adhesion interface 16 (illustrated in FIG. 2E).

The depositing step may include depositing the seed layer onto the support substrate by epitaxy. However, other methods as known in the art may be used. Also, the seed layer and the working layer may be detached from the composite substrate by the application of stress.

Optionally, the invention may further include applying a first bonding layer 13 onto the source substrate 10, and applying a second bonding layer 23 onto the support substrate 20. Preferably, the source substrate 10 includes implanted atomic species to a predetermined depth to form a weakened zone 14. The first and second bonding layers 13, 23 may be contacted to attach the source and support substrates, and then the seed layer 12 can be detached from the source substrate 10 at the weakened zone 14 and then transferred onto the support substrate 20. Thereafter, the working layer 30 may be deposited onto the seed layer 12, which has been transferred to the support substrate 20.

Advantageously, detaching steps occurring in the methods of this invention can include applying a stress such as mechanical stresses, thermal stresses, electrostatic stresses, laser irradiation stresses, or a combination thereof. If desired, the support may then be recycled and reused.

In yet another variant of the method of the invention, the working layer 16 of gallium nitride is substituted by a working layer 16 of aluminum nitride, of silicon carbide, an alloy of aluminum and of gallium, and alloy of gallium and indium such as InGaN, or another nitride or carbide compound. The working layer 16 of gallium nitride can also be substituted by a multilayer structure constituting a stack of layers of the gallium nitride, aluminum nitride, gallium and indium nitride, etc. types, possibly having different kinds of doping, etc.

In another variant, all or some of the components on the working layer 16 are made either before or after removing the support 12.

Example 3

In another embodiment of the method of the invention, a structure is provided comprising a working layer on a seed layer itself on a support with bonding layers and interposed between the seed layer and the support. A thick layer is deposited on the free surface of the working layer and the support is removed, either alone or together with the seed layer. The thick layer then serves in particular to support the working layer, after the seed layer support has been removed.

In this embodiment, the further layer of the substrate is present upon the working layer on a face opposite that of the seed layer, wherein the further layer preferably is polycrystalline SiC, polycrystalline AlN, polycrystalline GaN, boron nitride, diamond or a metal such a copper.

Table 2 below summarizes examples of materials that can be used in the context of this second implementation of the method of the invention. These examples are purely illustrative and should not be construed as limiting.

TABLE 2

| Working layer 16 | Seed layer 2 | Bonding layers 10, 11 | Support 12 | Thick layer 4 |
|---|---|---|---|---|
| GaN or AlN or AlGaN or GaInN or SiC or other | {111} Si or mono SiC or GaN or sapphire or NdGaO$_2$ or LiGa$_3$ | SiO$_2$ or Si$_3$N$_4$ | Poly SiC or poly AlN or sapphire or mono SiC or poly GaN | Diamond or poly SiC or GaN or AlN or boron nitride or metal (copper) |

In the preceding examples, the support substrate preferably comprises a material having a coefficient of thermal expansion of about 0.7 to 3 times the coefficient of the working layer. Preferably, the seed layer comprises a material so that throughout the expected range of temperatures neither the support nor the working layer is significantly damaged (e.g., by cracking, flaking, separation, increased dislocation densities, and the like). The effect of the coefficient of thermal expansion of the seed layer is insignificant in the structure as the layer is very thin compared to the thickness of the working layer and support substrate. This small thickness allows to avoid any damaging in the working layer during temperature changes as during the epitaxy.

Preferably, the values of the thermal expansion coefficients herein relate to those in a plane parallel to the plane of the working layer. Advantageously, the material selected to form the support presents thermal expansion coefficients that reduce or even eliminate significant tension or compression stresses of the kind that arise during the variations in temperature that are inherent when growing the working layer, or that occur when the substrate formed in this manner returns to ambient temperature.

Importantly, tolerance to the differences of the thermal expansion coefficients of the working layer and the support substrate materials, increases when these differences lead to compression in the working layer, as opposed to when it leads to stretching of the layer. Thus, thermal expansion coefficient of the support material can be several times greater than that of the working layer and that leads to compression of the working layer when temperature is cooling down after epitaxy. However, the thermal expansion coefficient of the support material is preferably not less than 0.7 times the coefficient of the working layer as the working layer is also stretched or extended when cooling down in this case.

Preferably, the nucleation layer or seed layer is selected such that thermal expansions of the support and/or the working layer do not cause significant wafer damage. For this purpose, the seed layer has a thickness that is small enough to enable it to be deformed so as to accommodate the dimensional variations due to thermal expansion of the support and/or of the working layer. This thickness depends on the seed layer material and on the respective materials of the support and of the working layer.

For example, a difference in the thermal expansion coefficients of the working layer and support substrate leads to a certain linear expansion or contraction of the seen layer. Then depending on the coefficients of elasticity of the seen layer, this linear expansion or contraction in turn leads to a force in the seen layer and its boundaries. If this force is small, flaking, fracturing, dislocations, and other damage (collectively, "damage") will not occur. Accordingly, one of ordinary skill in the art can readily determine an appropriate thickness for the seed layer by simply trying seed layers of various increasing or decreasing thicknesses. As used here, the phrase "the seen layer accommodates" means a seed layer that is not damaged by expansion and contraction of the working layer and the support substrate. And the phrase "a seed layer sufficient to accommodate" means a seed layer having physical properties (e.g., thickness and coefficients of elasticity) with respect to the physical properties of the working layer and the support substrate (e.g., coefficients of thermal expansion) so that significant damage does not occur to either the working layer or support substrate.

Typically, for a silicon carbide support having thickness of 300 microns (μm) and a gallium nitride working layer having thickness of several microns, a monocrystalline silicon carbide seed layer should have thickness that is less than 0.5 μm, and that is preferably less than 1000 angstroms (Å).

Advantageously, as mentioned above, the seed layer material also presents lattice parameters such that the working layer can be epitaxially grown on the seed layer with dislocations in the working layer at a concentration of less than $10^7/cm^2$. The skilled person knows how to select such seed materials (ex., GaN) and epitaxial growth parameters and orientations (ex., epitaxial lateral overgrowth conditions, primarily vertical growth conditions, lower deposition temperatures) both for the seed layer and for the working layer.

Clearly, the present invention is not limited to the preferred implementations described and shown in the drawings, and the skilled person is capable of providing variants and modifications, all of which are included within the scope of the appended claims.

The words "significant" and "likely" are used here to mean within acceptable and expected limits for the intended purpose. Often these are commercial purposes and commercially-acceptable limits, but commercial applications are not limiting. For example, in the phrase "significant wafer damage is unlikely in the process", the phrase "significant wafer damage" is taken to mean damage that limits or prevents intended uses, usually fabrication of devices on the wafer. This is necessarily relevant to the context in which the process is practiced, but nevertheless in all cases, can be readily determined by one of ordinary skill in the art.

Other words of degree are interpreted similarly. For example, the word "substantially" as used in the phrase "A is substantially the same as B" is taken to mean the A and B are the same within normal and expected tolerances, e.g., commercial tolerances, research tolerances, and the like. For example, the phrase "unlikely in the process" is taken to mean that, although significant damage may occur, it occurs sufficiently rarely that economical use of the process is not hindered or prevented. For example, greater the 98%, 95%, 90%, 85%, of the wafers are free of significant damage, the exact percent allowable varies in dependence on, e.g., the cost of the wafer.

The ranges signified by these terms depend on commercial requirements (or research requirements, or the like) and can vary but in all cases are not to be construed and imposing requirements beyond what are currently achievable given a current state-of-the-art. It should be understood that this invention is not limited to commercial uses; intended uses include research uses, special purpose uses, and so forth.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims.

What is claimed is:

1. A method of making a semiconductor substrate which comprises:
    providing an support that includes a barrier layer thereon for preventing loss by diffusion of elements derived from dissociation of the support at epitaxial growth temperatures;
    providing a seed layer on the barrier layer, wherein the seed layer facilitates epitaxial growth of a single crystal III-nitride semiconductor layer thereon;
    epitaxially growing a nitride working layer on the thin seed layer; and
    removing the support to form the substrate.

2. The method of claim 1, wherein the support is made of a sintered or polycrystalline material.

3. The method of claim 2, wherein the support comprises a polycrystalline silicon carbide, monocrystalline silicon carbide, polycrystalline aluminum nitride, polycrystalline gallium nitride, or monocrystalline gallium nitride having a concentration of dislocation that is greater than $10^7/cm^2$.

4. The method of claim 1, wherein the barrier layer comprises silicon nitride.

5. The method of claim 1, wherein the seed layer comprises sapphire, silicon carbide, zinc oxide, silicon, gallium nitride, neodymium gallate, or lithium gallate.

6. The method of claim 1, wherein the seed layer comprises a material with a crystal lattice parameter selected so that the nitride working layer has a dislocation concentration less than about $10^7/cm^2$.

7. The method of claim 1, wherein the nitride working layer comprises one or more layers of GaN, AlN, AlGaN, GaAlN, InGaN, or GaInN.

8. The method of claim 7, wherein the working layer is a stack of deposits of GaN with different types of doping.

9. The method of claim 8, wherein the stack of GaN is self supporting.

10. The method of claim 1, wherein the working layer is InGaN; the seed layer is GaN and the support substrate is sapphire.

11. The method of claim 1, wherein the support and the working layer each have substantially the same thermal expansion coefficient.

12. The method of claim 1, wherein the seed and nitride working layers are detached from the support by the application of stress at the intermediate layer.

13. The method of claim 1, wherein the seed layer is provided on the support by implanting ions into a source substrate to form a zone of weakness at a depth that corresponds to the desired thickness of the seed layer, bonding the source substrate to the support, and detaching the seed layer at the zone of weakness by the application of a force to transfer the seed layer to the support substrate.

14. The method of claim 1, which further comprises recycling the removed support for subsequent reuse.

15. The method of claim 1 which further comprises preparing the seed layer to receive the nitride working layer, wherein the preparation includes at least one of polishing, annealing, smoothing, oxidation, and etching.

* * * * *